United States Patent
Lin et al.

(10) Patent No.: US 7,666,709 B1
(45) Date of Patent: Feb. 23, 2010

(54) SEMICONDUCTOR DEVICE AND METHOD OF PLACING SEMICONDUCTOR DIE ON A TEMPORARY CARRIER USING FIDUCIAL PATTERNS

(75) Inventors: Yaojian Lin, Singapore (SG); Rui Huang, Singapore (SG); Hin Hwa Goh, Singapore (SG)

(73) Assignee: STATS ChipPAC, Ltd., Singapore (SG)

( * ) Notice: Subject to any disclaimer, the term of this patent is extended or adjusted under 35 U.S.C. 154(b) by 0 days.

(21) Appl. No.: 12/332,077

(22) Filed: Dec. 10, 2008

(51) Int. Cl.
*H01L 21/44* (2006.01)
(52) U.S. Cl. .................. 438/106; 438/107; 438/109; 438/111; 438/113; 438/118; 438/123; 438/125; 257/E21.503
(58) Field of Classification Search .......... None
See application file for complete search history.

(56) References Cited

U.S. PATENT DOCUMENTS

| | | | |
|---|---|---|---|
| 6,022,761 A * | 2/2000 | Grupen-Shemansky et al. | 438/125 |
| 6,759,277 B1 * | 7/2004 | Flores et al. | 438/117 |
| 7,189,593 B2 * | 3/2007 | Lee | 438/107 |
| 2006/0255458 A1 | 11/2006 | Dangelmaier | |
| 2008/0029890 A1 | 2/2008 | Cheng | |

* cited by examiner

*Primary Examiner*—N Drew Richards
*Assistant Examiner*—Kyoung Lee
(74) *Attorney, Agent, or Firm*—Robert D. Atkins

(57) ABSTRACT

A semiconductor device has an adhesive layer depositing over a temporary carrier. A plurality of fiduciary patterns is formed over the adhesive layer. A repassivation layer is formed over semiconductor die. The repassivation layer may be a plurality of discrete regions. Alignment slots are formed in the repassivation layer. The fiducial patterns and alignment slots have slanted sidewalls. Leading with the repassivation layer, the semiconductor die is placed onto the carrier so that the alignment slots envelope and lock to the fiducial patterns. Alternatively, a die without the repassivation layer is placed between the fiducial patterns. An encapsulant is deposited over the semiconductor die while the die remain locked to the fiducial patterns. The carrier, adhesive layer, and fiducial patterns are removed after depositing the encapsulant. An interconnect structure is formed over the repassivation layer to electrically connect to contact pads on the semiconductor die.

22 Claims, 12 Drawing Sheets

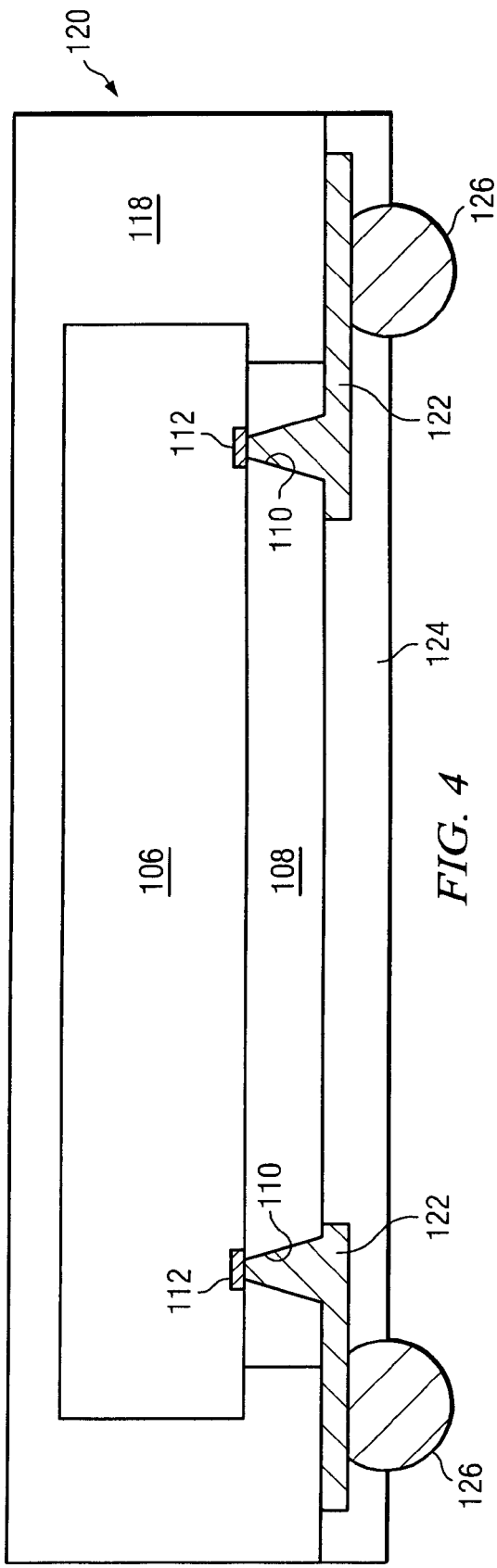
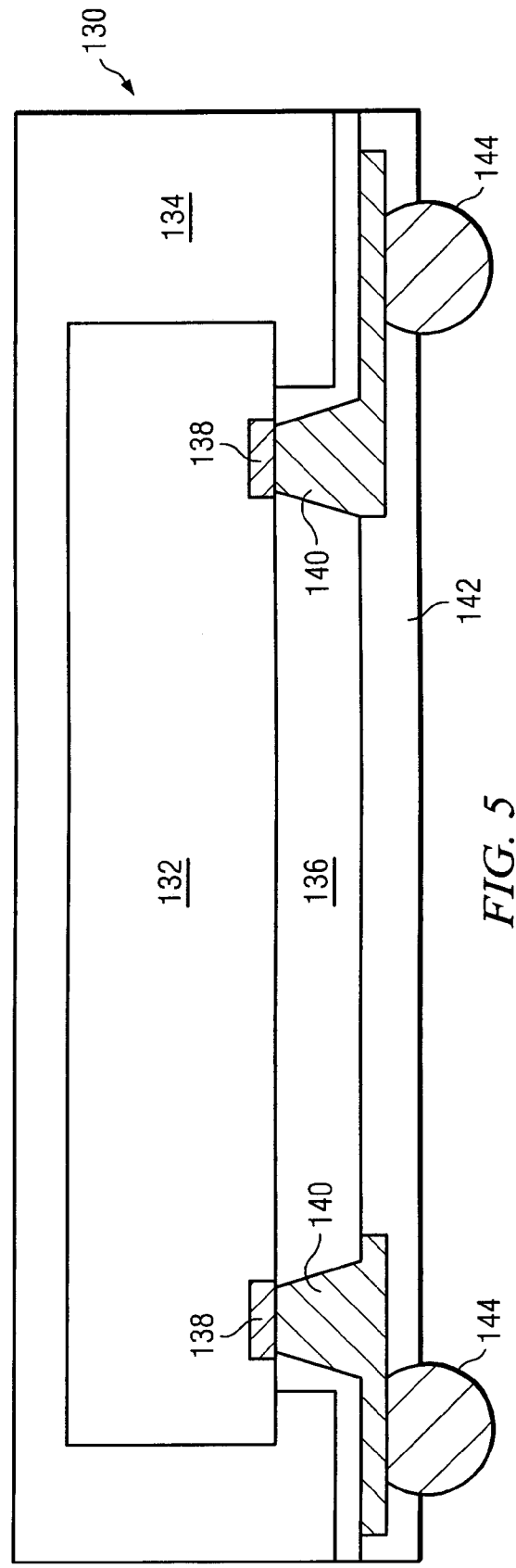

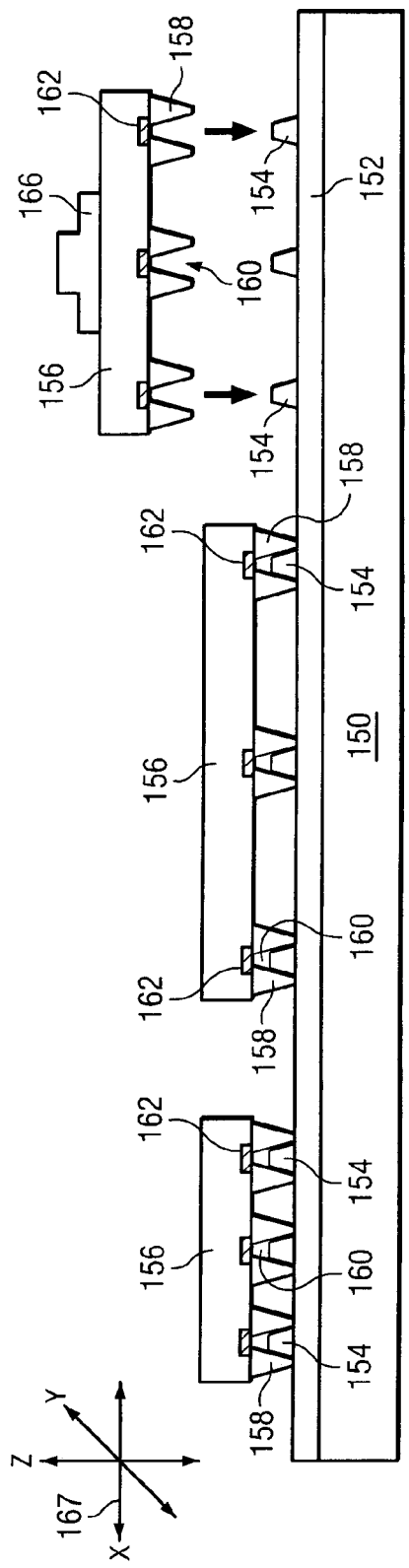
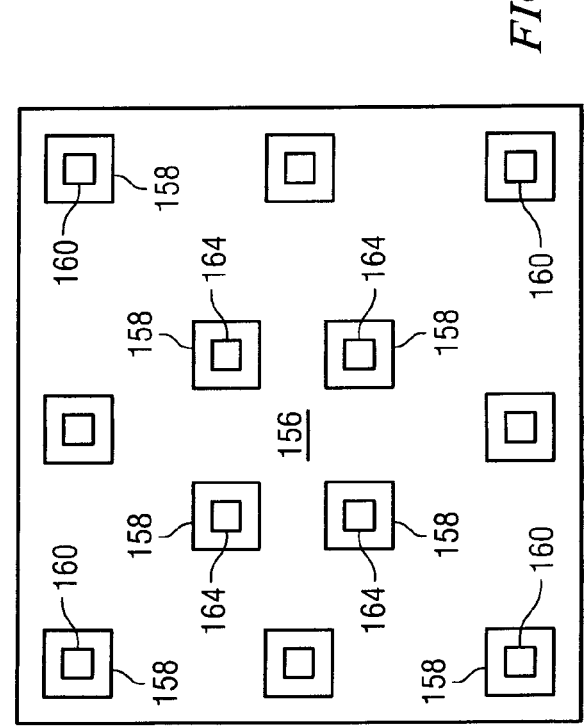
FIG. 6a
FIG. 6b

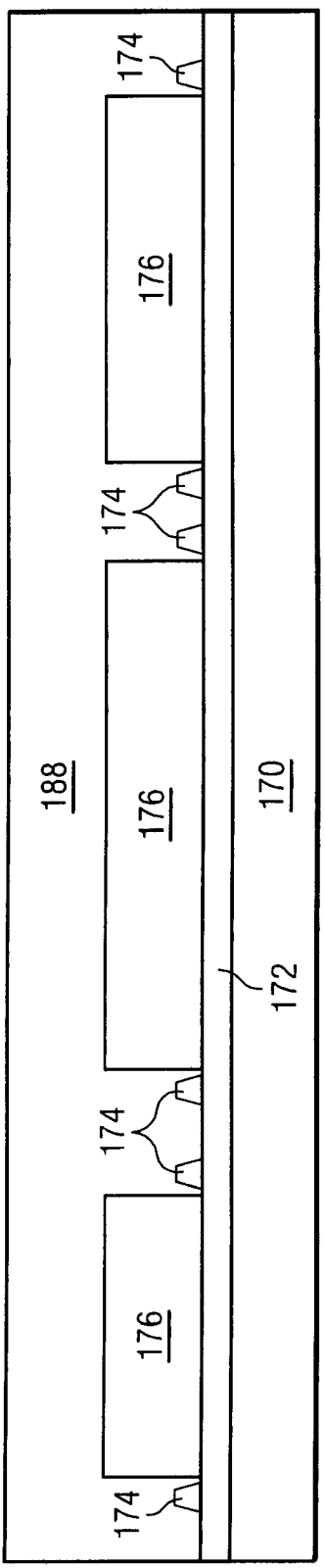
FIG. 7f
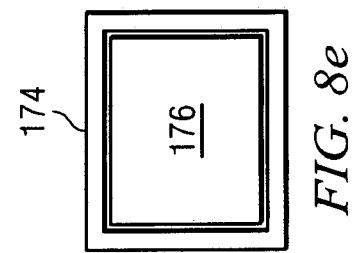
FIG. 8e
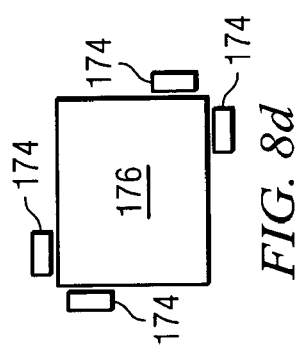
FIG. 8d
FIG. 8c
FIG. 8b
FIG. 8a

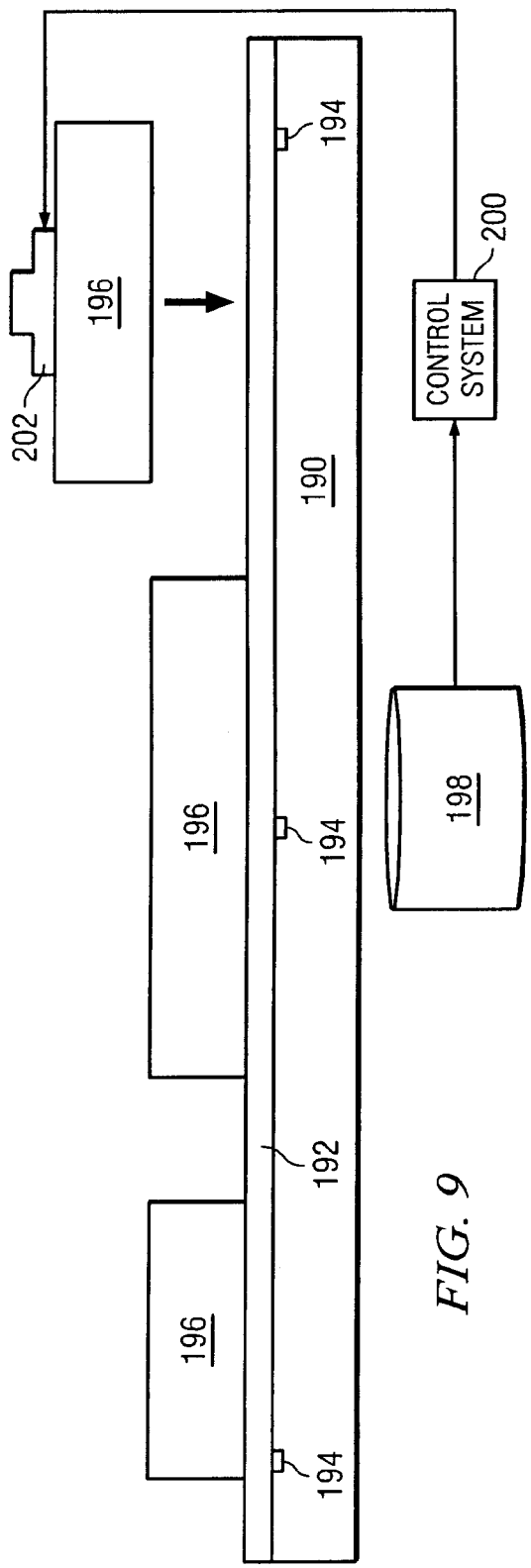
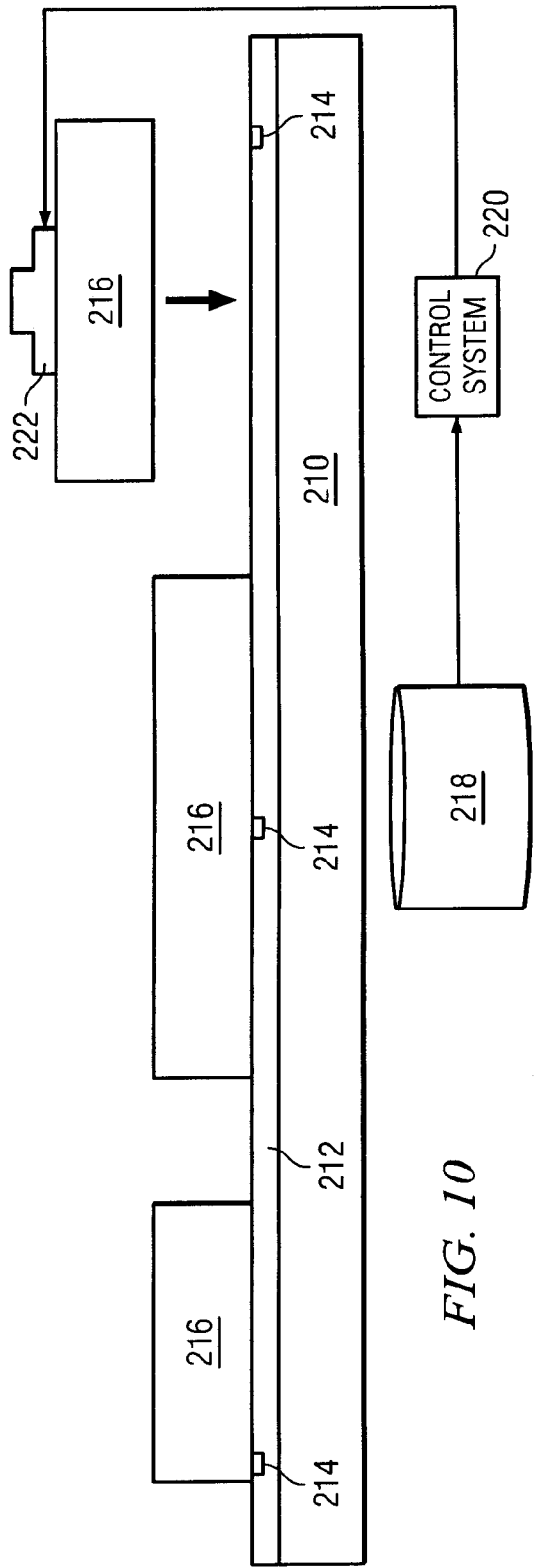
FIG. 9
FIG. 10

SEMICONDUCTOR DEVICE AND METHOD OF PLACING SEMICONDUCTOR DIE ON A TEMPORARY CARRIER USING FIDUCIAL PATTERNS

FIELD OF THE INVENTION

The present invention relates in general to semiconductor devices and, more particularly, to a semiconductor device formed by placing semiconductor die on a temporary carrier using fiducial patterns.

BACKGROUND OF THE INVENTION

Semiconductor devices are commonly found in modern electronic products. Semiconductor devices vary in the number and density of electrical components. Discrete semiconductor devices generally contain one type of electrical component, e.g., light emitting diode (LED), transistor, resistor, capacitor, inductor, and power metal oxide semiconductor field effect transistor (MOSFET). Integrated semiconductor devices typically contain hundreds to millions of electrical components. Examples of integrated semiconductor devices include microcontrollers, microprocessors, charged-coupled devices (CCDs), solar cells, and digital micro-mirror devices (DMDs).

Semiconductor devices perform a wide range of functions such as high-speed calculations, transmitting and receiving electromagnetic signals, controlling electronic devices, transforming sunlight to electricity, and creating visual projections for television displays. Semiconductor devices are found in the fields of entertainment, communications, power generation, networks, computers, and consumer products. Semiconductor devices are also found in electronic products including military, aviation, automotive, industrial controllers, and office equipment.

Semiconductor devices exploit the electrical properties of semiconductor materials. The atomic structure of semiconductor material allows its electrical conductivity to be manipulated by the application of an electric field or through the process of doping. Doping introduces impurities into the semiconductor material to manipulate and control the conductivity of the semiconductor device.

A semiconductor device contains active and passive electrical structures. Active structures, including transistors, control the flow of electrical current. By varying levels of doping and application of an electric field, the transistor either promotes or restricts the flow of electrical current. Passive structures, including resistors, diodes, and inductors, create a relationship between voltage and current necessary to perform a variety of electrical functions. The passive and active structures are electrically connected to form logic circuits, which enable the semiconductor device to perform high-speed calculations and other useful functions.

Semiconductor devices are generally manufactured using two complex manufacturing processes, i.e., front-end manufacturing, and back-end manufacturing, each involving potentially hundreds of steps. Front-end manufacturing involves the formation of a plurality of die on the surface of a semiconductor wafer. Each die is typically identical and contains circuits formed by electrically connecting active and passive components. Back-end manufacturing involves singulating individual die from the finished wafer and packaging the die to provide structural support and environmental isolation.

One goal of semiconductor manufacturing is to produce smaller semiconductor devices. Smaller devices typically consume less power, have higher performance, and can be produced more efficiently. In addition, smaller semiconductor devices have a smaller footprint, which is desirable for smaller end products. A smaller die size may be achieved by improvements in the front-end process resulting in die with smaller, higher density active and passive components. Back-end processes may result in semiconductor device packages with a smaller footprint by improvements in electrical interconnection and packaging materials.

When forming wafer-level chip-scale packages (WLCSPs), it is necessary to place semiconductor die on a temporary carrier. The semiconductor die are then encapsulated with a molding compound. The temporary carrier is removed and an interconnect structure is formed on the backside of the semiconductor die. The placement of semiconductor die on the carrier requires a high precision die bonder and certain process optimizations. The die bonder is typically limited to a die placement tolerance of 25 micrometer ($\mu$m). In addition, the semiconductor die may shift in placement on the carrier during the encapsulation process. Any misalignment or movement of the semiconductor die from its optimal location can affect subsequent manufacturing processes.

SUMMARY OF THE INVENTION

A need exists to establish and maintain placement of semiconductor die on a temporary carrier. Accordingly, in one embodiment, the present invention is a method of making a semiconductor device comprising the steps of providing a carrier, depositing an adhesive layer over the carrier, forming a plurality of fiduciary patterns over the adhesive layer, forming a repassivation layer over semiconductor die, forming alignment slots in the repassivation layer, and leading with the repassivation layer, placing the semiconductor die onto the carrier so that the alignment slots envelope and lock to the fiducial patterns. The method further includes the steps of depositing an encapsulant over the semiconductor die while the alignment slots remain locked to the fiducial patterns, removing the carrier, adhesive layer, and fiducial patterns after depositing the encapsulant, and forming an interconnect structure over the repassivation layer. The interconnect structure is electrically connected to contact pads on an active surface of the semiconductor die.

In another embodiment, the present invention is a method of making a semiconductor device comprising the steps of providing a carrier, depositing an adhesive layer over the carrier, forming a plurality of fiduciary patterns over the adhesive layer, forming a first layer over semiconductor die, forming alignment slots in the first layer, placing the semiconductor die onto the carrier so that the alignment slots envelope and lock to the fiducial patterns, and depositing an encapsulant over the semiconductor die while the alignment slots remain locked to the fiducial patterns.

In another embodiment, the present invention is a method of making a semiconductor device comprising the steps of providing a carrier, forming a plurality of fiduciary patterns over the carrier, forming a first layer over semiconductor die, forming alignment slots in the first layer, placing the semiconductor die onto the carrier so that the alignment slots envelope and lock to the fiducial patterns, and depositing an encapsulant over the semiconductor die while the alignment slots remain locked to the fiducial patterns.

In another embodiment, the present invention is a method of making a semiconductor device comprising the steps of providing a carrier, forming a plurality of fiduciary patterns over the carrier, placing the semiconductor die onto the carrier so that the semiconductor die locks to the fiducial patterns, and depositing an encapsulant over the semiconductor die while the semiconductor die remains locked to the fiducial patterns.

BRIEF DESCRIPTION OF THE DRAWINGS

FIG. 4 illustrates a FO-WLCSP with interconnect structure formed through the repassivation layer;

FIG. 5 illustrates a FO-WLCSP formed by placing semiconductor die on a carrier using fiducial patterns on the carrier and alignment slots formed in a photoresist layer;

FIGS. 6a-6c illustrate an alternate process of placing semiconductor die on a carrier using fiducial patterns on the carrier and alignment slots formed in a repassivation layer;

FIGS. 7a-7f illustrate another process of placing semiconductor die on a carrier using fiducial patterns on the carrier;

FIGS. 8a-8e illustrate a variety of fiducial patterns formed on the carrier for placement of the semiconductor die;

FIG. 9 illustrates fiducial patterns placed on a carrier for alignment of semiconductor die; and FIG. 10 illustrates fiducial patterns placed on an adhesive layer for alignment of semiconductor die.

DETAILED DESCRIPTION OF THE DRAWINGS

Figure 1:
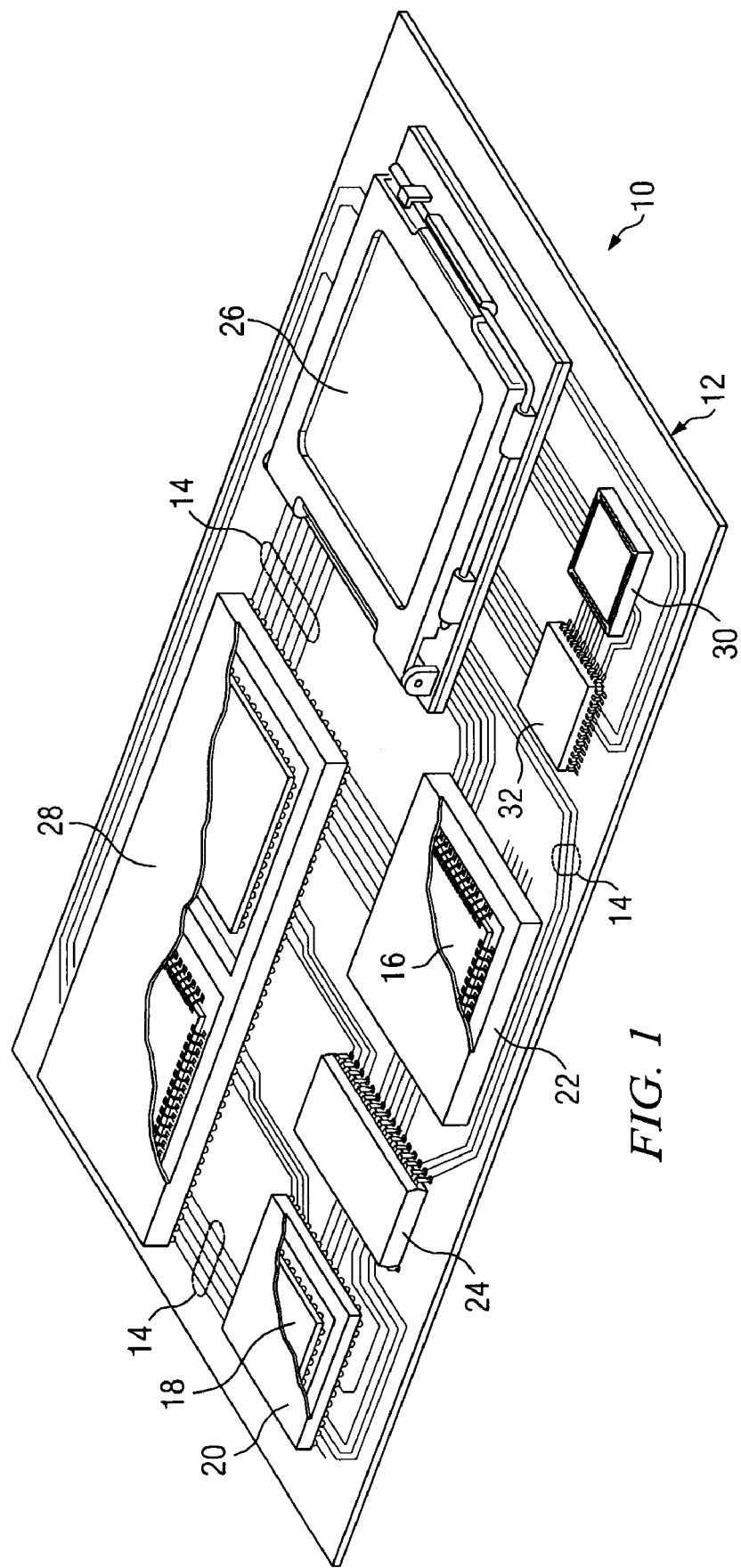
FIG. 1 illustrates a printed circuit board (PCB) with different types of packages mounted to its surface.

The present invention is described in one or more embodiments in the following description with reference to the Figures, in which like numerals represent the same or similar elements. While the invention is described in terms of the best mode for achieving the invention's objectives, it will be appreciated by those skilled in the art that it is intended to cover alternatives, modifications, and equivalents as may be included within the spirit and scope of the invention as defined by the appended claims and their equivalents as supported by the following disclosure and drawings.

Semiconductor devices are generally manufactured using two complex manufacturing processes: front-end manufacturing and back-end manufacturing. Front-end manufacturing involves the formation of a plurality of die on the surface of a semiconductor wafer. Each die on the wafer contains active and passive electrical components, which are electrically connected to form functional electrical circuits. Active electrical components, such as transistors, have the ability to control the flow of electrical current. Passive electrical components, such as capacitors, inductors, resistors, and transformers, create a relationship between voltage and current necessary to perform electrical circuit functions.

Passive and active components are formed on the surface of the semiconductor wafer by a series of process steps including doping, deposition, photolithography, etching, and planarization. Doping introduces impurities into the semiconductor material by techniques such as ion implantation or thermal diffusion. The doping process modifies the electrical conductivity of semiconductor material in active devices, transforming the semiconductor material into a permanent insulator, permanent conductor, or changing the way the semiconductor material changes in conductivity in response to an electric field. Transistors contain regions of varying types and degrees of doping arranged as necessary to enable the transistor to promote or restrict the flow of electrical current upon the application of an electric field.

Active and passive components are formed by layers of materials with different electrical properties. The layers can be formed by a variety of deposition techniques determined in part by the type of material being deposited. For example, thin film deposition may involve chemical vapor deposition (CVD), physical vapor deposition (PVD), electrolytic plating, and electroless plating processes. Each layer is generally patterned to form portions of active components, passive components, or electrical connections between components.

The layers can be patterned using photolithography, which involves the deposition of light sensitive material, e.g., photoresist, over the layer to be patterned. A pattern is transferred from a photomask to the photoresist using light. The portion of the photoresist pattern subjected to light is removed using a solvent, exposing portions of the underlying layer to be patterned. The remainder of the photoresist is removed, leaving behind a patterned layer. Alternatively, some types of materials are patterned by directly depositing the material into the areas or voids formed by a previous deposition/etch process using techniques such as electroless and electrolytic plating.

Depositing a thin film of material over an existing pattern can exaggerate the underlying pattern and create a non-uniformly flat surface. A uniformly flat surface is required to produce smaller and more densely packed active and passive components. Planarization can be used to remove material from the surface of the wafer and produce a uniformly flat surface. Planarization involves polishing the surface of the wafer with a polishing pad. An abrasive material and corrosive chemical are added to the surface of the wafer during polishing. The combined mechanical action of the abrasive and corrosive action of the chemical removes any irregular topography, resulting in a uniformly flat surface.

Back-end manufacturing refers to cutting or singulating the finished wafer into the individual die and then packaging the die for structural support and environmental isolation. To singulate the die, the wafer is scored and broken along non-functional regions of the wafer called saw streets or scribes. The wafer is singulated using a laser cutting device or saw blade. After singulation, the individual die are mounted to a package substrate that includes pins or contact pads for interconnection with other system components. Contact pads formed over the semiconductor die are then connected to contact pads within the package. The electrical connections can be made with solder bumps, stud bumps, conductive paste, or wirebonds. An encapsulant or other molding material is deposited over the package to provide physical support and electrical isolation. The finished package is then inserted into an electrical system and the functionality of the semiconductor device is made available to the other system components.

FIG. 1 illustrates electronic device 10 having a chip carrier substrate or printed circuit board (PCB) 12 with a plurality of semiconductor packages mounted on its surface. Electronic device 10 may have one type of semiconductor package, or multiple types of semiconductor packages, depending on the application. The different types of semiconductor packages are shown in FIG. 1 for purposes of illustration.

Electronic device 10 may be a stand-alone system that uses the semiconductor packages to perform an electrical function. Alternatively, electronic device 10 may be a subcomponent of a larger system. For example, electronic device 10 may be a graphics card, network interface card, or other signal processing card that can be inserted into a computer. The semiconductor package can include microprocessors, memories, application specific integrated circuits (ASICs), logic circuits, analog circuits, RF circuits, discrete devices, or other semiconductor die or electrical components.

In FIG. 1, PCB 12 provides a general substrate for structural support and electrical interconnect of the semiconductor packages mounted on the PCB. Conductive signal traces 14 are formed on a surface or within layers of PCB 12 using evaporation, electrolytic plating, electroless plating, screen printing, PVD, or other suitable metal deposition process. Signal traces 14 provide for electrical communication between each of the semiconductor packages, mounted components, and other external system components. Traces 14 also provide power and ground connections to each of the semiconductor packages.

In some embodiments, a semiconductor device has two packaging levels. First level packaging is a technique for mechanically and electrically attaching the semiconductor die to a carrier. Second level packaging involves mechanically and electrically attaching the carrier to the PCB. In other embodiments, a semiconductor device may only have the first level packaging where the die is mechanically and electrically mounted directly to the PCB.

For the purpose of illustration, several types of first level packaging, including wire bond package 16 and flip chip 18, are shown on PCB 12. Additionally, several types of second level packaging, including ball grid array (BGA) 20, bump chip carrier (BCC) 22, dual in-line package (DIP) 24, land grid array (LGA) 26, multi-chip module (MCM) 28, quad flat non-leaded package (QFN) 30, and quad flat package 32, are shown mounted on PCB 12. Depending upon the system requirements, any combination of semiconductor packages, configured with any combination of first and second level packaging styles, as well as other electronic components, can be connected to PCB 12. In some embodiments, electronic device 10 includes a single attached semiconductor package, while other embodiments call for multiple interconnected packages. By combining one or more semiconductor packages over a single substrate, manufacturers can incorporate pre-made components into electronic devices and systems. Because the semiconductor packages include sophisticated functionality, electronic devices can be manufactured using cheaper components and a shorter manufacturing process. The resulting devices are less likely to fail and less expensive to manufacture resulting in lower costs for consumers.

Figure 2A:
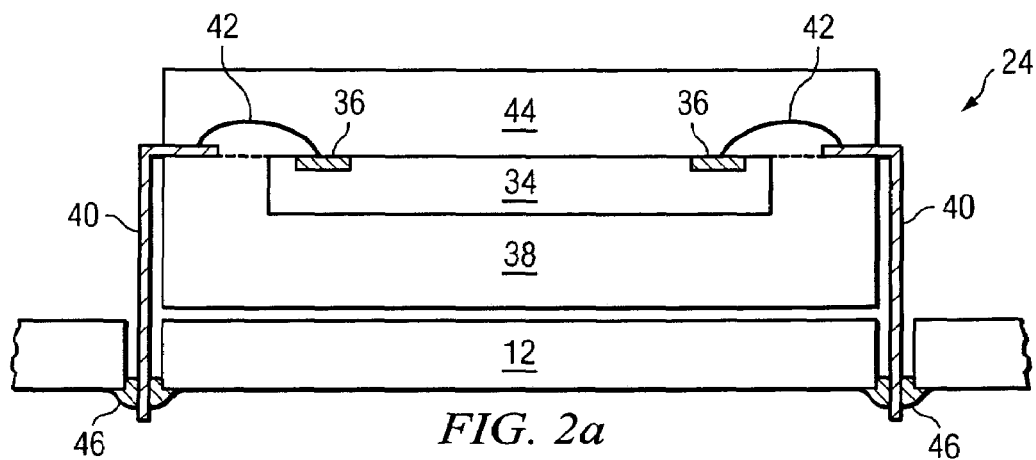
FIGS. 2a-2c illustrate further detail of the representative semiconductor packages mounted to the PCB.

FIG. 2a illustrates further detail of DIP 24 mounted on PCB 12. DIP 24 includes semiconductor die 34 having contact pads 36. Semiconductor die 34 includes an active region containing analog or digital circuits implemented as active devices, passive devices, conductive layers, and dielectric layers formed within semiconductor die 34 and are electrically interconnected according to the electrical design of the die. For example, the circuit may include one or more transistors, diodes, inductors, capacitors, resistors, and other circuit elements formed within the active region of die 34. Contact pads 36 are made with a conductive material, such as aluminum (Al), copper (Cu), tin (Sn), nickel (Ni), gold (Au), or silver (Ag), and are electrically connected to the circuit elements formed within die 34. Contact pads 36 are formed by PVD, CVD, electrolytic plating, or electroless plating process. During assembly of DIP 24, semiconductor die 34 is mounted to a carrier 38 using a gold-silicon eutectic layer or adhesive material such as thermal epoxy. The package body includes an insulative packaging material such as polymer or ceramic. Conductor leads 40 are connected to carrier 38 and wire bonds 42 are formed between leads 40 and contact pads 36 of die 34 as a first level packaging. Encapsulant 44 is deposited over the package for environmental protection by preventing moisture and particles from entering the package and contaminating die 34, contact pads 36, or wire bonds 42. DIP 24 is connected to PCB 12 by inserting leads 40 into holes formed through PCB 12. Solder material 46 is flowed around leads 40 and into the holes to physically and electrically connect DIP 24 to PCB 12. Solder material 46 can be any metal or electrically conductive material, e.g., Sn, lead (Pb), Au, Ag, Cu, zinc (Zn), bismuthinite (Bi), and alloys thereof, with an optional flux material. For example, the solder material can be eutectic Sn/Pb, high-lead, or lead-free.

Figure 2B:
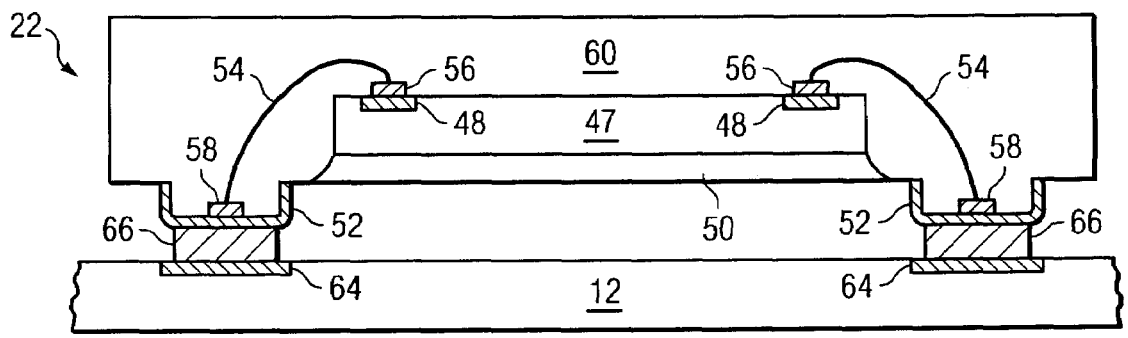

FIG. 2b illustrates further detail of BCC 22 mounted on PCB 12. Semiconductor die 47 is connected to a carrier by wire bond style first level packaging. BCC 22 is mounted to PCB 12 with a BCC style second level packaging. Semiconductor die 47 having contact pads 48 is mounted over a carrier using an underfill or epoxy-resin adhesive material 50. Semiconductor die 47 includes an active region containing analog or digital circuits implemented as active devices, passive devices, conductive layers, and dielectric layers formed within semiconductor die 47 and are electrically interconnected according to the electrical design of the die. For example, the circuit may include one or more transistors, diodes, inductors, capacitors, resistors, and other circuit elements formed within the active region of die 47. Contact pads 48 are made with a conductive material, such as Al, Cu, Sn, Ni, Au, or Ag, and are electrically connected to the circuit elements formed within die 47. Contact pads 48 are formed by PVD, CVD, electrolytic plating, or electroless plating process. Wire bonds 54 and bond pads 56 and 58 electrically connect contact pads 48 of semiconductor die 47 to contact pads 52 of BCC 22 forming the first level packaging. Molding compound or encapsulant 60 is deposited over semiconductor die 47, wire bonds 54, contact pads 48, and contact pads 52 to provide physical support and electrical isolation for the device. Contact pads 64 are formed on a surface of PCB 12 using evaporation, electrolytic plating, electroless plating, screen printing, PVD, or other suitable metal deposition process and are typically plated to prevent oxidation. Contact pads 64 electrically connect to one or more conductive signal traces 14. Solder material is deposited between contact pads 52 of BCC 22 and contact pads 64 of PCB 12. The solder material is reflowed to form bumps 66 which form a mechanical and electrical connection between BCC 22 and PCB 12.

Figure 2C:
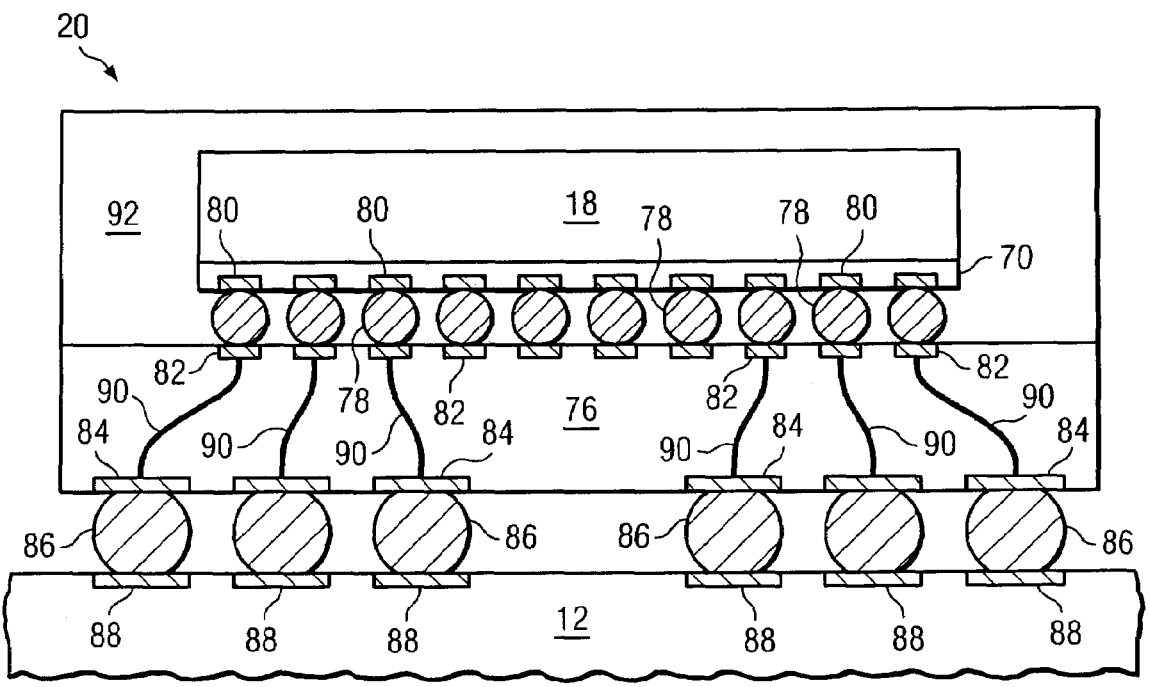

In FIG. 2c, semiconductor die 18 is mounted face down to carrier 76 with a flip chip style first level packaging. BGA 20 is attached to PCB 12 with a BGA style second level packaging. Active region 70 containing analog or digital circuits implemented as active devices, passive devices, conductive layers, and dielectric layers formed within semiconductor die 18 is electrically interconnected according to the electrical design of the die. For example, the circuit may include one or more transistors, diodes, inductors, capacitors, resistors, and other circuit elements formed within active region 70 of semiconductor die 18. Semiconductor die 18 is electrically and mechanically attached to carrier 76 through a large number of individual conductive solder bumps or balls 78. Solder bumps 78 are formed on bump pads or interconnect sites 80, which are disposed on active region 70. Bump pads 80 are made with a conductive material, such as Al, Cu, Sn, Ni, Au, or Ag, and are electrically connected to the circuit elements formed in active region 70. Bump pads 80 are formed by PVD, CVD, electrolytic plating, or electroless plating process. Solder bumps 78 are electrically and mechanically connected to contact pads or interconnect sites 82 on carrier 76 by a solder reflow process.

BGA 20 is electrically and mechanically attached to PCB 12 by a large number of individual conductive solder bumps or balls 86. The solder bumps are formed on bump pads or interconnect sites 84. The bump pads 84 are electrically connected to interconnect sites 82 through conductive lines 90 routed through carrier 76. Contact pads 88 are formed on a surface of PCB 12 using evaporation, electrolytic plating, electroless plating, screen printing, PVD, or other suitable metal deposition process and are typically plated to prevent oxidation. Contact pads 88 electrically connect to one or more conductive signal traces 14. The solder bumps 86 are electrically and mechanically connected to contact pads or bonding pads 88 on PCB 12 by a solder reflow process. Molding compound or encapsulant 92 is deposited over semiconductor die 18 and carrier 76 to provide physical support and electrical isolation for the device. The flip chip semiconductor device provides a short electrical conduction path from the active devices on semiconductor die 18 to conduction tracks on PCB 12 in order to reduce signal propagation distance, lower capacitance, and achieve overall better circuit performance. In another embodiment, the semiconductor die 18 can be mechanically and electrically attached directly to PCB 12 using flip chip style first level packaging without carrier 76.

Figure 3A:
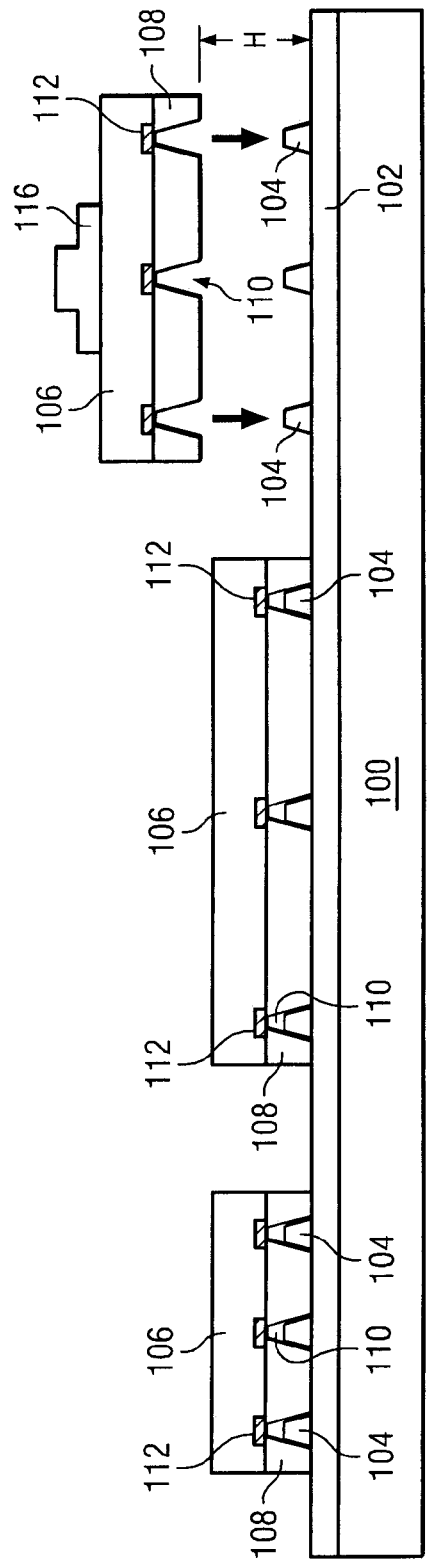
FIGS. 3a-3f illustrate a process of placing semiconductor die on a carrier using fiducial patterns on the carrier and alignment slots formed in a repassivation layer.

FIGS. 3a-3f illustrate a process of forming a fanout wafer level chip scale package (FO-WLCSP) by precisely aligning and locking semiconductor die to a carrier using fiducial patterns. FIG. 3a shows a temporary process carrier or substrate 100 with an adhesive layer 102 deposited on its surface. Carrier 100 is a dummy or sacrificial base material such as silicon, ceramic, glass, metal, or other suitable low-cost, rigid material. Adhesive layer 102 can be a flexible plastic base film, such as polyvinyl chloride (PVC) or polyolefin, with a synthetic acrylic adhesive, thermal sensitive, ultraviolet (UV)-sensitive adhesive, for device mounting and removal. Adhesive layer 102 is releasable by light, heat, laser, or mechanical pressure. Adhesive layer 102 is deposited using spin coating or printing, and may include a laminated polymer adhesive or UV curable liquid adhesive. Alternatively, an adhesive material, such as thermal epoxy, polymer composite, or inorganic bonding compounds, can be applied to carrier 100.

A plurality of protruding dams or fiducial patterns 104 are patterned and deposited on adhesive layer 102. Patterns 104 match with slots 110 on die 106 In one embodiment, patterns 104 are made with photoresist, polyimide, or other suitable photo-imageable, or stencil printed material. Alternatively, patterns 104 can be metal, polymer, or other rigid material. Patterns 104 are formed using spin coating, screen printing, or spray coating with UV light exposure and wet chemistry development. Alternatively, patterns 104 can be formed with metal stencil printing. Patterns 104 are positioned at predetermined locations to provide local alignment or guidance for placement of semiconductor die 106. For example, patterns 104 can be placed in an interior and/or peripheral region within a circumference of each semiconductor die 106. Patterns 104 are matched with I/O pads position in order to prevent any potential flashing of molding compound into I/O pads on die 106. Alternatively, there are other arrangements of patterns 104, e.g., rectangular, circular, triangular, oval, "L" shape, "X" shape, "+" shape, "T" shape, diagonal, corners, etc., can also provide the desired x and y directional local alignment of semiconductor die 106. Patterns 104 can also be a sealing ring surrounding the 108 at die edge.

Semiconductor die 106 includes an active area containing analog or digital circuits implemented as active devices, passive devices, conductive layers, and dielectric layers formed within the die and are electrically interconnected according to the electrical design of the die. Semiconductor die 106 further includes passivation, repassivation layer, or temporary protection layer 108 patterned and deposited on its active surface. Layer 108 can be polyimide, silicon dioxide ($SiO_2$), silicon nitride ($Si_3N_4$), silicon oxynitride (SiON), tantalum pentoxide ($Ta_2O_5$), aluminum oxide ($Al_2O_3$), benzocyclobutene (BCB), polybenzoxazoles (PBO), or other suitable material having similar insulating and structural properties. The deposition of repassivation layer 108 may involve spin coating, CVD, printing, or spray coating.

Figure 3B:
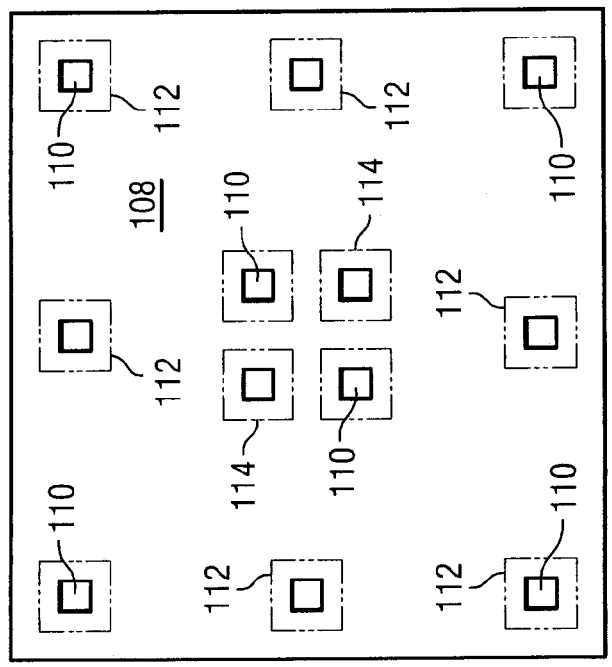

A plurality of alignment slots or notches 110 are developed, etched or drilled into layer 108. The location of alignment slots 110 are selected to match with patterns 104 so that semiconductor die 106 are locally aligned to provide a predetermined placement on carrier 100. FIG. 3b shows a bottom view of layer 108 with alignment slots 110. Alignment slots 110 can be formed over contact pads 112 on semiconductor die 106, or over die passivation layer 114.

A plurality of alignment slots or notches 110 are etched or drilled into repassivation layer 108. The location of alignment slots 110 are selected to match with patterns 104 so that semiconductor die 106 are locally aligned to provide a predetermined placement on carrier 100. FIG. 3b shows a bottom view of repassivation layer 108 with alignment slots 110. Alignment slots 110 can be formed over contact pads 112 on semiconductor die 106, or over die passivation layer 114.

Figure 3C:
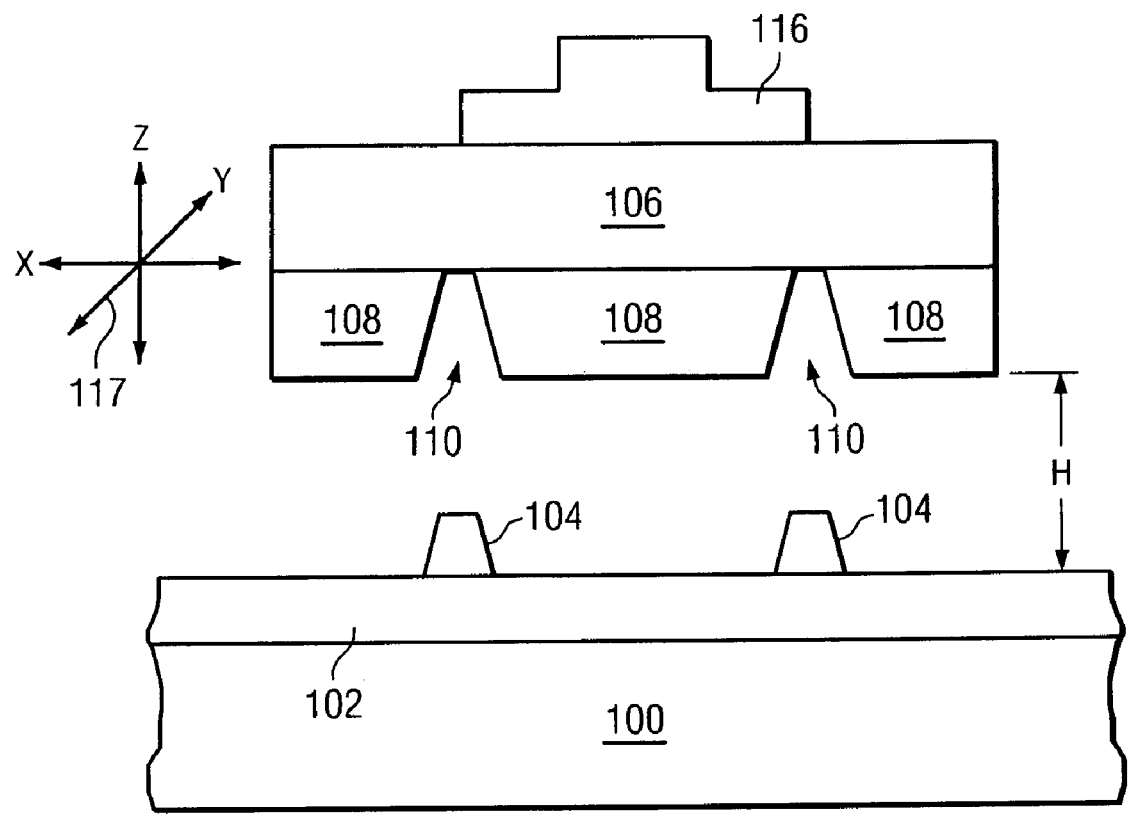
Figure 3D:
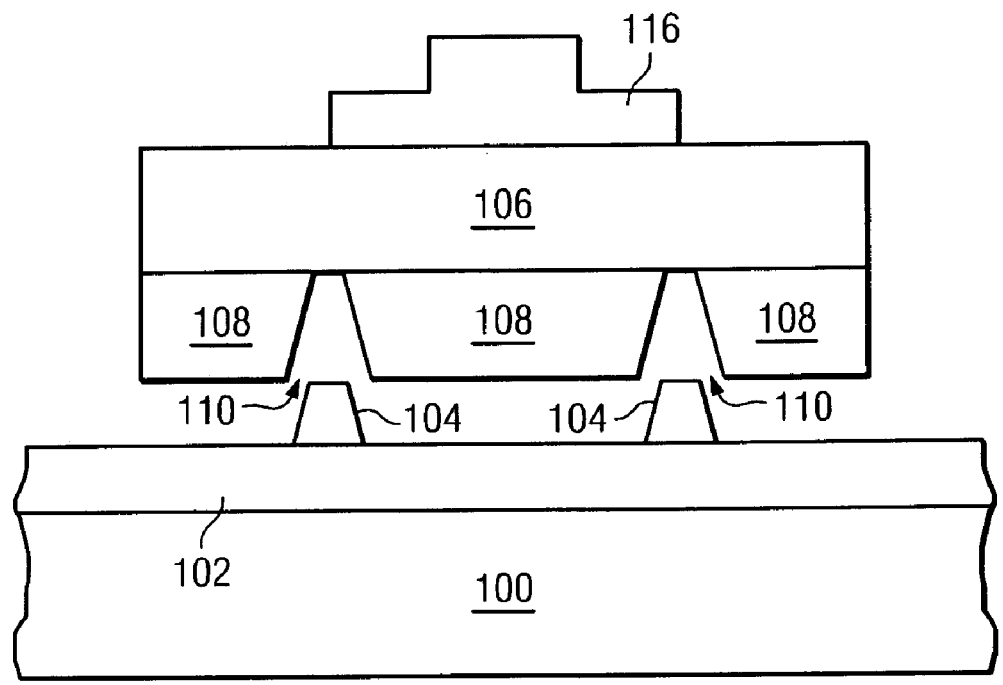

In FIG. 3c, bond head 116 is movable in the x and y directions, as shown by arrows 117, to approximately place semiconductor die 106 a distance H over patterns 104 to coincide with alignment slots 110. Bond head 116 then moves in the z direction to lower semiconductor die 106 onto patterns 104, see FIG. 3d. The height of patterns 104 is made less than the thickness of repassivation layer 108 so that repassivation layer 108 contacts adhesive layer 102 during die placement, leaving a gap between the top of patterns 104 and repassivation layer 108. The cross-sectional area of the top of patterns 104 is less than the cross-sectional area of alignment slots 110. Patterns 104 and alignment slots 110 also have sidewalls formed with the similar or same angle of slant to aid in alignment and engagement. The slanted sidewalls of alignment slots 110 slide into place along the complementary slanted sidewalls of patterns 104. Any x or y offset between the centerlines of patterns 104 and alignment slots 110 is compensated by x-y adjustments of bond head 116, as well as the difference in cross-section areas of the structures and the slanted sidewalls, which provide mechanical guidance for final placement of the die.

Figure 3E:
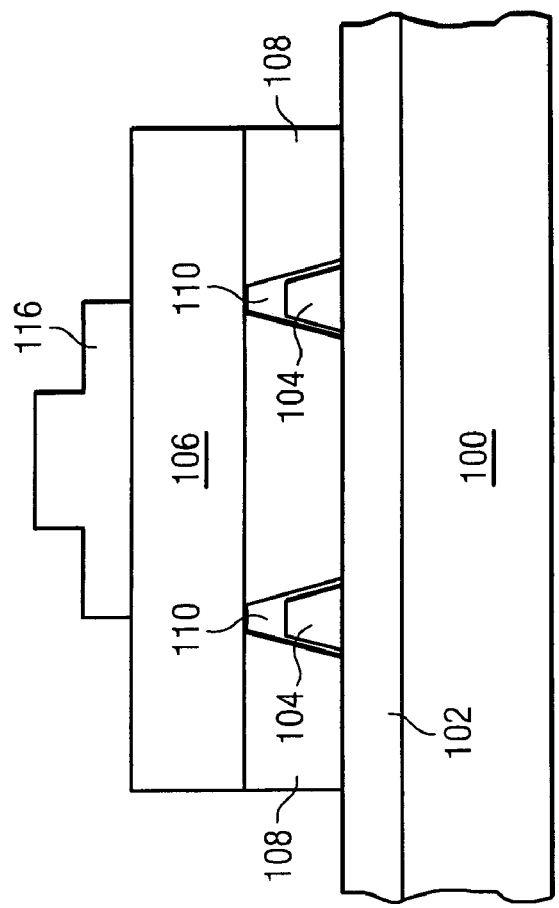

FIG. 3e shows patterns 104 enveloped by alignment slots 110 to align and lock semiconductor die to carrier 100. Each pattern 104 fits into a corresponding alignment slot 110. Thus, patterns 104 have caused semiconductor die 106 to be precisely aligned with respect to one another, typically within a 5 micrometer (µm) tolerance, and locked into their respective x-y position with a robust structure at predetermined locations in the horizontal plane of carrier 100. Patterns 104 and alignment slots 110 can be keyed, e.g., patterns 104 and alignment slots 110 in three corners of semiconductor die 106, so that the die can be mounted in only one orientation. By mechanically guiding alignment slots 110 onto patterns 104, semiconductor die 106 are placed on carrier 100 with ease and certainty in their relative location.

Figure 3F:
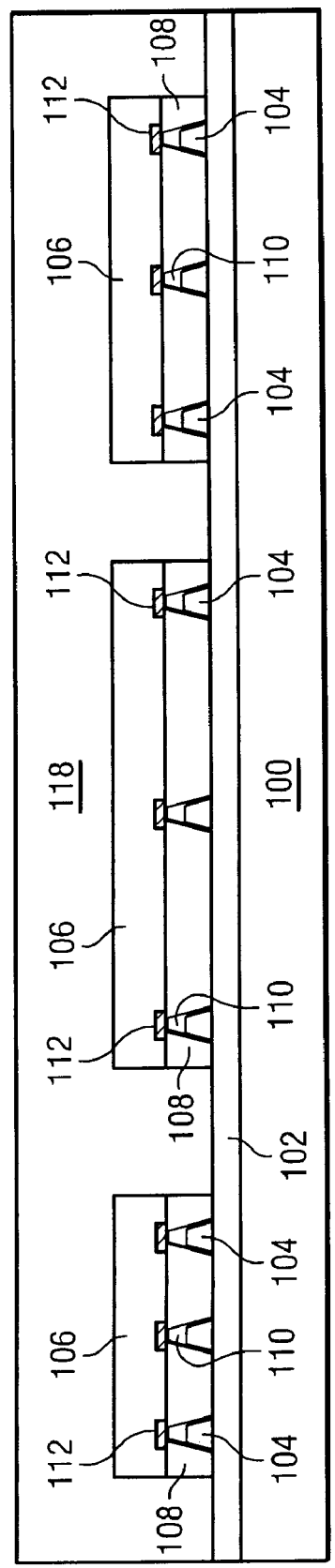

In FIG. 3f, an encapsulant or molding compound 118 is deposited over and around semiconductor die 106 and repassivation layer 108 using a screen printing, compressive molding, transfer molding, liquid encapsulant molding, liquid dispensing, or other suitable applicator. Encapsulant 118 can be epoxy resin, epoxy acrylate, polymer, or polymer composite material. Encapsulant 118 is non-conductive and environmentally protects the semiconductor device from external elements and contaminants.

During the deposition of encapsulant 118, semiconductor die 106 are locked in their respective x-y position with the robust structure provided by the matched patterns 104 and alignment slots 110 to enhance structural stability and minimize any physical shift during subsequent manufacturing processes, such as die encapsulation. Thus, transverse movement of semiconductor die 106 during subsequent manufacturing processes is substantially eliminated.

After deposition of encapsulant 118, carrier 100, adhesive layer 102, and patterns 104 are removed by thermal releasing, mechanical peel-off, chemical stripping, chemical etching, chemical mechanical polishing (CMP), or mechanical grinding.

FIG. 4 shows one FO-WLSCP 120 with semiconductor die 106 and repassivation layer 108 enclosed by encapsulant 118. Prior to singulation, an electrically conductive layer 122 is formed over repassivation layer 108 and fills alignment slots 110. Conductive layer 122 can be Al, Cu, Sn, Ni, Au, Ag, or other suitable electrically conductive material. Conductive layer 122 is formed by PVD, CVD, electrolytic plating, or electroless plating process. Conductive layer 122 electrically connects to contact pads 112. Conductive layer 122 can be a redistribution layers (RDL).

An insulating layer 124 is formed over conductive layer 122 and repassivation layer 108. The insulating layer 124 can be polymer base photosensitive dielectric, such as low temperature (<250° C.) cured dielectric film, SiO2, Si3N4, SiON, Ta2O5, zircon (ZrO2), Al2O3, or other material having suitable insulating properties. The deposition of insulating layer 124 may involve spin coating, PVD, CVD, or printing. The insulating layer 124 can be single or multiple layers. A portion of insulating layer 124 is removed to expose conductive layer 122.

An electrically conductive solder material is deposited over conductive layer 122 using an evaporation, electrolytic plating, electroless plating, ball drop, or screen printing process. The solder material can be any metal or electrically conductive material, e.g., Sn, Ni, Au, Ag, Pb, Bi, and alloys thereof, with an optional flux material. For example, the solder material can be eutectic Sn/Pb, high-lead, or lead-free. The solder material is reflowed by heating the material above its melting point to form spherical balls or bumps 126. In some applications, solder bumps 126 are reflowed a second time to improve electrical contact to conductive layer 122. Solder bumps 126 represent one type of interconnect structure that can be formed on conductive layer 122. The interconnect structure can also use bond wires, 3D interconnects, conductive paste, or other electrical interconnect. The assembly is singulated with saw blade or laser tool to provide individual FO-WLCSP 120.

In an alternate embodiment, a temporary photoresist layer is formed on the semiconductor die instead of the repassivation layer. Similar to FIG. 3a, a plurality of alignment slots is formed in the temporary photoresist. The semiconductors are placed over patterns so that the alignment slots coincide with and envelope the patterns on the adhesive layer. Accordingly, the patterns cause the semiconductor die to be precisely aligned with respect to one another and locked into their respective x-y position with a robust structure at predetermined locations in the horizontal plane of the temporary carrier. An encapsulant or molding compound is formed over the semiconductor die while the die is locked in placed by the matched patterns and alignment slots. The semiconductor die 106 remain in their respective x-y position due to the robust structure provided by the matched patterns and alignment. The temporary carrier, adhesive layer, fiducial patterns, and temporary photoresist are then removed by chemical etching, mechanical peel-off, CMP, or mechanical grinding.

FIG. 5 shows FO-WLSCP 130 made using the aforedescribed temporary photoresist layer. Semiconductor die 132 is enclosed by encapsulant 134. Prior to singulation, an insulating layer 136 is formed over the active surface of semiconductor die 132 and contact pad 138, i.e., in the area vacated by the temporary photoresist layer. The insulating layer 136 can be polymer base photosensitive dielectric, such as low temperature (<250° C.) cured dielectric film, SiO2, Si3N4, SiON, Ta2O5, ZrO2, Al2O3, or other material having suitable insulating properties. The deposition of insulating layer 136 may involve spin coating, PVD, CVD, or printing. The insulating layer 136 can be single or multiple layers. A portion of insulating layer 136 is removed to expose contact pads 138.

An electrically conductive layer 140 is formed over and follows the contour of insulating layer 136. Conductive layer 140 can be Al, Cu, Sn, Ni, Au, Ag, or other suitable electrically conductive material. Conductive layer 140 is formed by PVD, CVD, electrolytic plating, or electroless plating process. Conductive layer 140 electrically connects to contact pads 138. Conductive layer 140 can be an RDL.

An insulating layer 142 is formed over conductive layer 140 and insulating layer 136. The insulating layer 142 can be polymer base photosensitive dielectric, such as low temperature (<250° C.) cured dielectric film, SiO2, Si3N4, SiON, Ta2O5, ZrO2, Al2O3, or other material having suitable insulating properties. The deposition of insulating layer 142 may involve spin coating, PVD, CVD, or printing. The insulating layer 142 can be single or multiple layers. A portion of insulating layer 142 is removed to expose conductive layer 140.

An electrically conductive solder material is deposited over conductive layer 140 using an evaporation, electrolytic plating, electroless plating, ball drop, or screen printing process. The solder material can be any metal or electrically conductive material, e.g., Sn, Ni, Au, Ag, Pb, Bi, and alloys thereof, with an optional flux material. For example, the solder material can be eutectic Sn/Pb, high-lead, or lead-free. The solder material is reflowed by heating the material above its melting point to form spherical balls or bumps 144. In some applications, solder bumps 144 are reflowed a second time to improve electrical contact to conductive layer 140. Solder bumps 144 represent one type of interconnect structure that can be formed on conductive layer 140. The interconnect structure can also use bond wires, 3D interconnects, conductive paste, or other electrical interconnect. The assembly is singulated with saw blade or laser tool to provide individual FO-WLCSP 130.

Figure 6C:
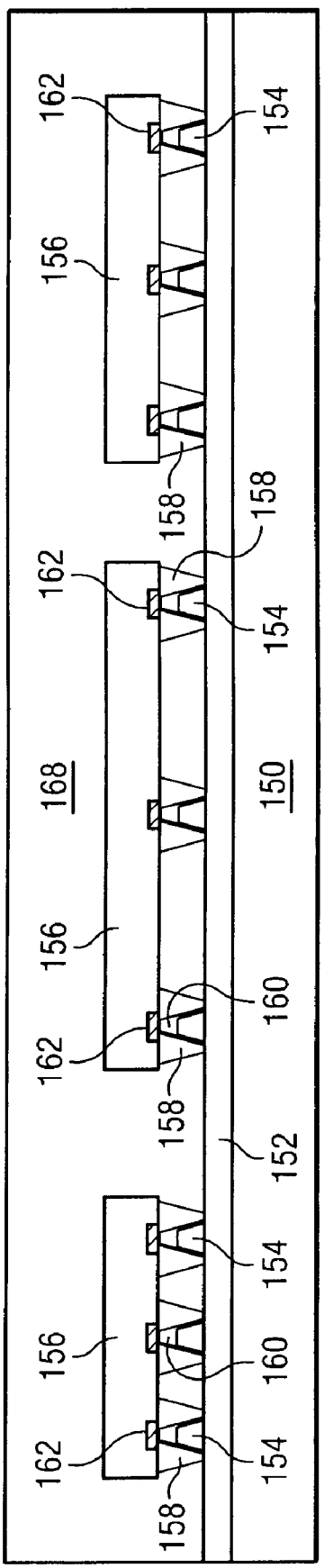

FIGS. 6a-6c show an alternate process of forming a FO-WLCSP by precisely aligning and locking semiconductor die to a carrier using fiducial patterns. FIG. 6a shows a temporary process carrier or substrate 150 with an adhesive layer 152 deposited on its surface. Carrier 150 is a dummy or sacrificial base material such as silicon, ceramic, glass, metal, or other suitable low-cost, rigid material. Adhesive layer 152 can be a flexible plastic base film, such as PVC or polyolefin, with a synthetic acrylic adhesive or UV-sensitive adhesive, for device mounting and removal. Adhesive layer 152 is releasable by light, heat, laser, or mechanical pressure. Adhesive layer 152 is deposited using spin coating or printing, and may include a laminated polymer adhesive or UV curable liquid adhesive. Alternatively, an adhesive material, such as thermal epoxy, polymer composite or inorganic bonding compounds, can be applied to carrier 150.

A plurality of protruding dams or fiducial patterns 154 are patterned and deposited on adhesive layer 152. In one embodiment, patterns 154 are made with photoresist, polyimide, or other suitable photo-imageable material. Alternatively, patterns 154 can be metal, polymer, or other rigid material. Patterns 154 are formed using screen printing, plating, CVD, PVD, imprint, or other suitable deposition process. Patterns 154 are positioned at predetermined locations to provide local alignment or guidance for placement of semiconductor die 156.

Semiconductor die 156 includes an active area containing analog or digital circuits implemented as active devices, passive devices, conductive layers, and dielectric layers formed within the die and are electrically interconnected according to the electrical design of the die. Semiconductor die 156 further includes repassivation layer 158 patterned and deposited on its active surface. Repassivation layer 158 can be polyimide, SiO2, Si3N4, SiON, Ta2O5, Al2O3, BCB, PBO, or other suitable material having similar insulating and structural properties. The deposition of repassivation layer 158 may involve spin coating, PVD, CVD, or printing.

Repassivation layer 158 is formed as individual discrete regions over contact pads 162 or die passivation layer 164, as shown in FIG. 6b. For example, repassivation layer 158 is formed as a plurality of squares covering one or more contact pads 162 or portions of die passivation layer 164. A plurality of alignment openings or notches 160 are etched or drilled into each discrete region of repassivation layer 158. The remaining portion of repassivation layer 158 circumscribe or surround contact pads 162 or the portions of die passivation layer 164 over which repassivation layer 158 was originally formed. The location of alignment openings 160 are selected to match with patterns 154 so that semiconductor die 156 are locally aligned to provide a predetermined placement on carrier 150.

In FIG. 6a, bond head 166 is movable in the x and y directions as shown by arrows 167 to approximately place semiconductor die 156 a distance H over patterns 154 to coincide with alignment openings 160. Bond head 166 then moves in the z direction to lower semiconductor die 156 onto patterns 154. The height of patterns 154 is made less than the thickness of repassivation layer 158 so that repassivation layer 158 contacts adhesive layer 152 during die placement, leaving a gap between the top of patterns 154 and repassivation layer 158. The cross-sectional area of the top of patterns 154 is less than the cross-sectional area of alignment openings 160. Patterns 154 and alignment openings 160 also have sidewalls formed with the same angle of slant to aid in alignment and engagement. The slanted sidewalls of alignment openings 160 slide into place along the complementary slanted sidewalls of patterns 154. Any x or y offset between the centerlines of patterns 154 and alignment openings 160 is compensated by x-y adjustments of bond head 166, as well as the difference in cross-section areas of the structures and the slanted sidewalls, which provide mechanical guidance for final placement of the die.

FIG. 6a shows patterns 154 enveloped by alignment openings 160 to align and lock semiconductor die 156 to carrier 150. Each pattern 154 fits into a corresponding alignment opening 160. Thus, patterns 154 have caused semiconductor die 156 to be precisely aligned with respect to one another, typically within a 5-10 μm tolerance, and locked into their respective x-y position with a robust structure at predetermined locations in the horizontal plane of carrier 150. Patterns 154 and alignment openings 160 can be keyed, e.g., patterns 154 and alignment openings 160 in three corners of semiconductor die 156, so that the die can be mounted in only one orientation. By mechanically guiding alignment openings 160 onto patterns 154, semiconductor die 156 are placed on carrier 150 with ease and certainty in their relative location.

In FIG. 6c, an encapsulant or molding compound 168 is deposited over and around semiconductor die 156 using a screen printing, compressive molding, transfer molding, liquid encapsulant molding, liquid dispensing, or other suitable applicator. Encapsulant 168 can be epoxy resin, epoxy acrylate, polymer, or polymer composite material. Encapsulant 168 is non-conductive and environmentally protects the semiconductor device from external elements and contaminants.

During the deposition of encapsulant 168, semiconductor die 156 are locked in their respective x-y position with the robust structure provided by the matched patterns 154 and alignment openings 160 to enhance structural stability and minimize any physical shift during subsequent manufacturing processes, such as die encapsulation. Thus, transverse movement of semiconductor die 156 during subsequent manufacturing processes is substantially eliminated.

After deposition of encapsulant 168, carrier 150, adhesive layer 152, and patterns 154 are removed by thermal releasing, chemical stripping, chemical etching, mechanical peel-off, CMP, or mechanical grinding. An interconnect structure is formed on contact pads 162 as described in FIGS. 4 and 5.

Figure 7A:
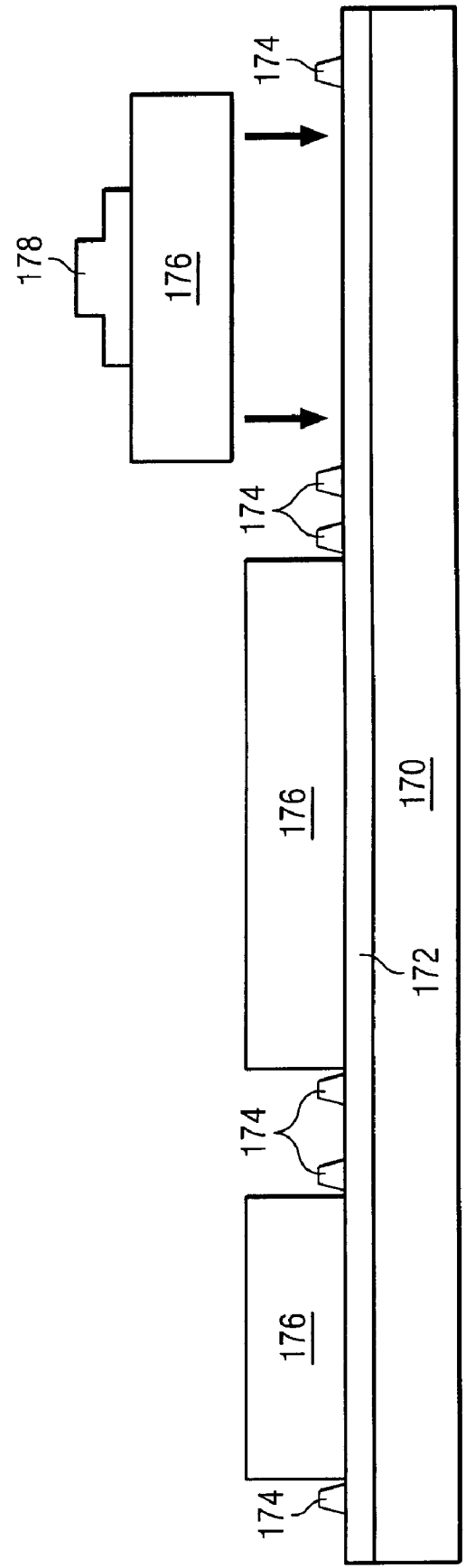

FIGS. 7a-7f show another process of forming a FO-WLCSP by precisely aligning and locking semiconductor die to a carrier using fiducial patterns. FIG. 7a shows a temporary process carrier or substrate 170 with an adhesive layer 172 deposited on its surface. Carrier 170 is a transparent dummy or sacrificial base material such as glass or other suitable low-cost, rigid material capable of passing light.

A plurality of protruding dams or fiducial patterns 174 are patterned and deposited on adhesive layer 172. In one embodiment, patterns 174 are made with photoresist, polyimide, or other suitable photo-imageable, or stencil printed material. Alternatively, patterns 174 can be metal, polymer, or other rigid material. Patterns 174 are formed using spin coating, screen printing, or spray coating with UV light exposure and wet chemistry development. Alternatively, patterns 174 can be formed with metal stencil printing. Patterns 174 are positioned at predetermined locations to provide local alignment or guidance for placement of semiconductor die 176.

In the present embodiment, patterns 174 are placed at select locations around an outside perimeter of each semiconductor die 176 For example, FIG. 8a shows a top view semiconductor die 176 placed between "+" shaped patterns 174. The corners of semiconductor die 176 are disposed in respective corners of the "+" shaped patterns 174. FIG. 8b shows semiconductor die 176 placed between "L" shaped patterns 174. The corners of semiconductor die 176 are disposed in respective corners of "L" shaped patterns 174. FIG. 8c shows linear patterns 174 formed proximate to a mid-region of each side of semiconductor die 176. FIG. 8d shows linear patterns 174 formed proximate to opposing corners of semiconductor die 176. FIG. 8e shows patterns 174 surrounding semiconductor die 176. In each case, patterns 174 provide proper local alignment and orientation of semiconductor die 176 and hold the die in place during subsequent manufacturing processes.

Figure 7B:
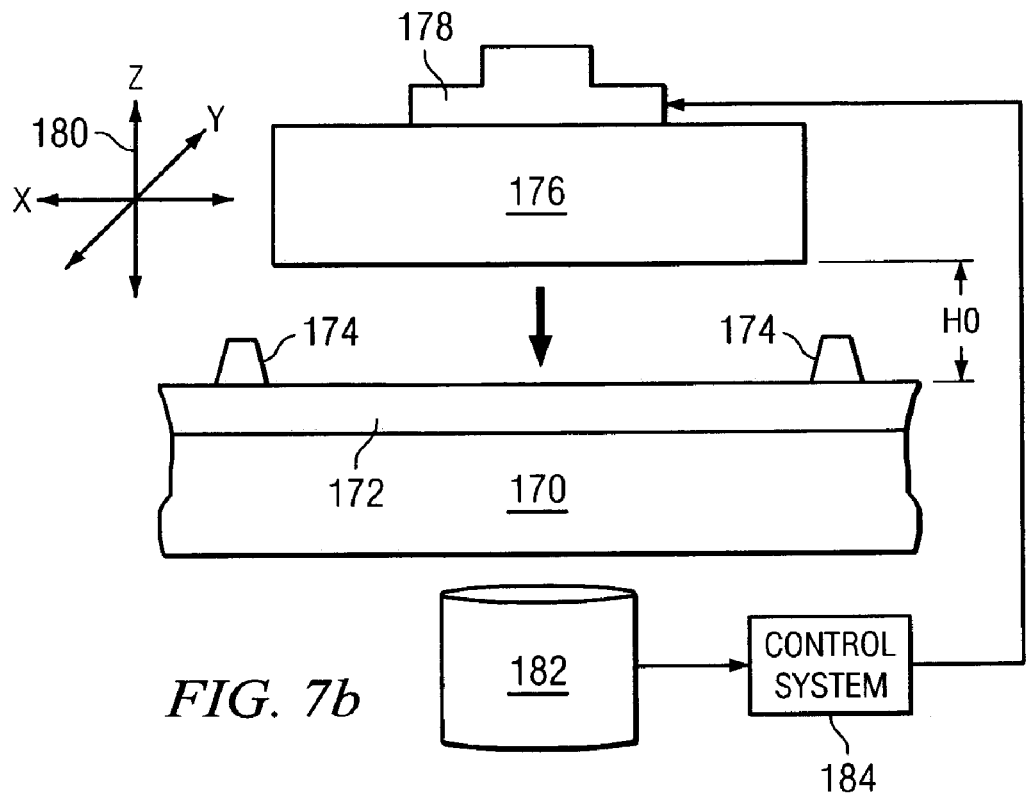
Figure 7C:
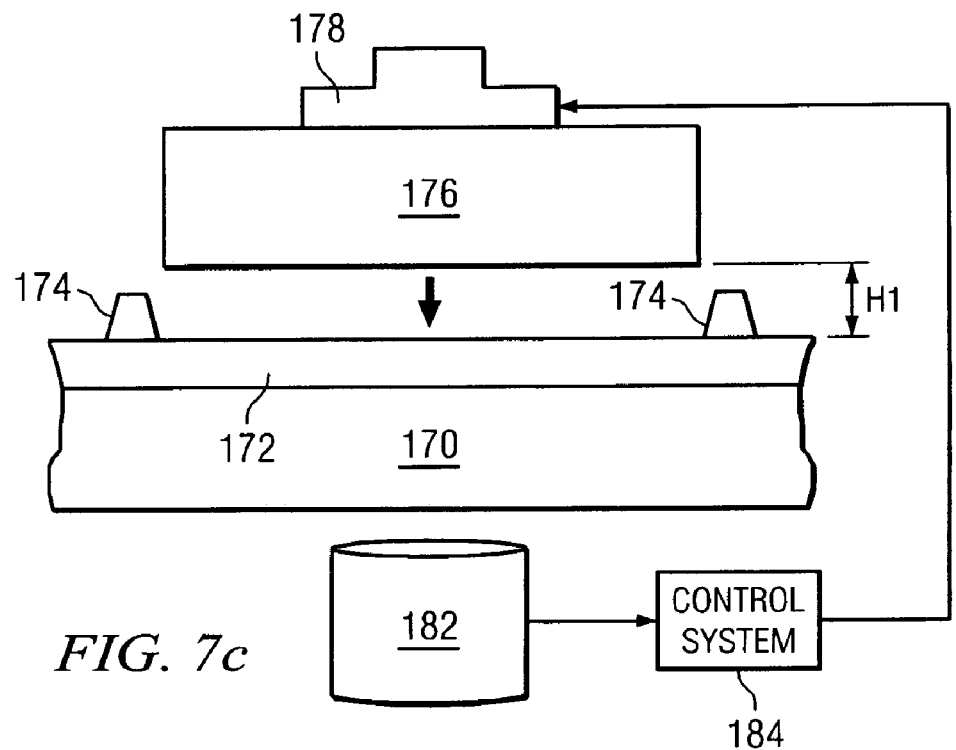
Figure 7D:
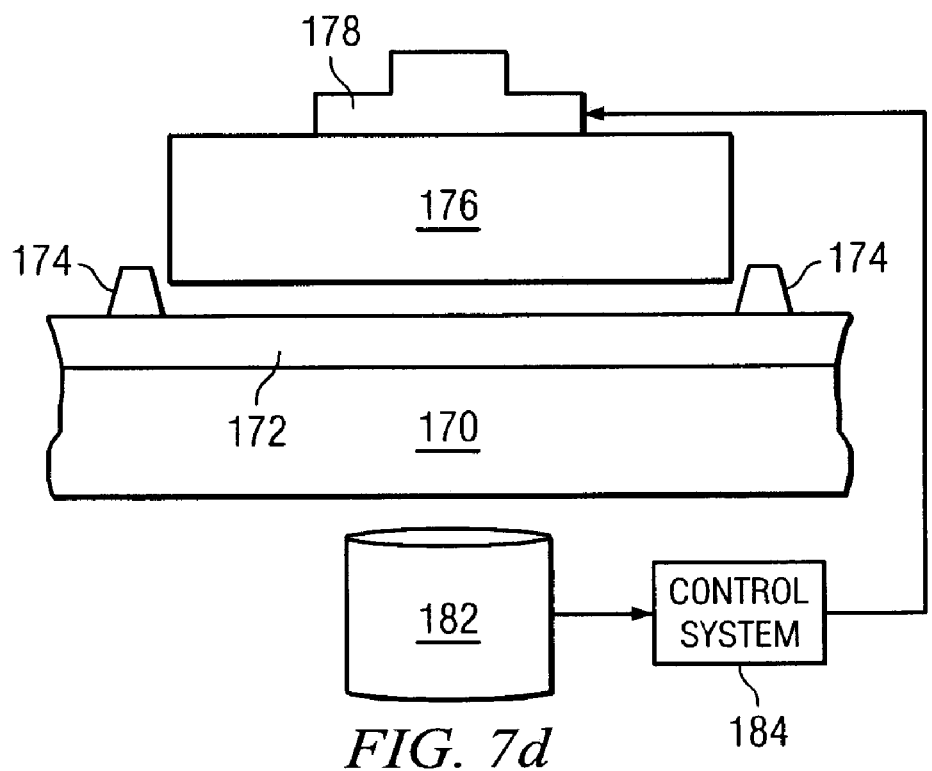

In FIG. 7b, bond head 178 is movable in the x and y directions as shown by arrows 180 to approximately place semiconductor die 176 a distance H0 over patterns 174. Camera 182 records digital images of semiconductor die 176 through transparent carrier 170. In one embodiment, camera 182 is a charge coupled device (CCD). The digital images are provided to control system 184, which in turn controls the x-y directional movement of bond head 178. Control system 184 uses image processing analysis and motor drivers to move bond head 178 until semiconductor die 176 is positioned between patterns 174. Bond head 178 then moves in the z direction to lower semiconductor die 176 between patterns 174, see FIG. 7c. Control system 184 may provide further x-y alignment of semiconductor die 176 at distance H1. Patterns 174 have slanted sidewalls to aid in alignment and engagement. Any x or y offset between semiconductor die 176 and patterns 174 is detected as semiconductor die 176 touches the slanted sidewalls and compensated by making x-y adjustments of bond head 178, as shown in FIG. 7d. The slanted sidewalls provide mechanical guidance for final placement of the die.

Figure 7E:
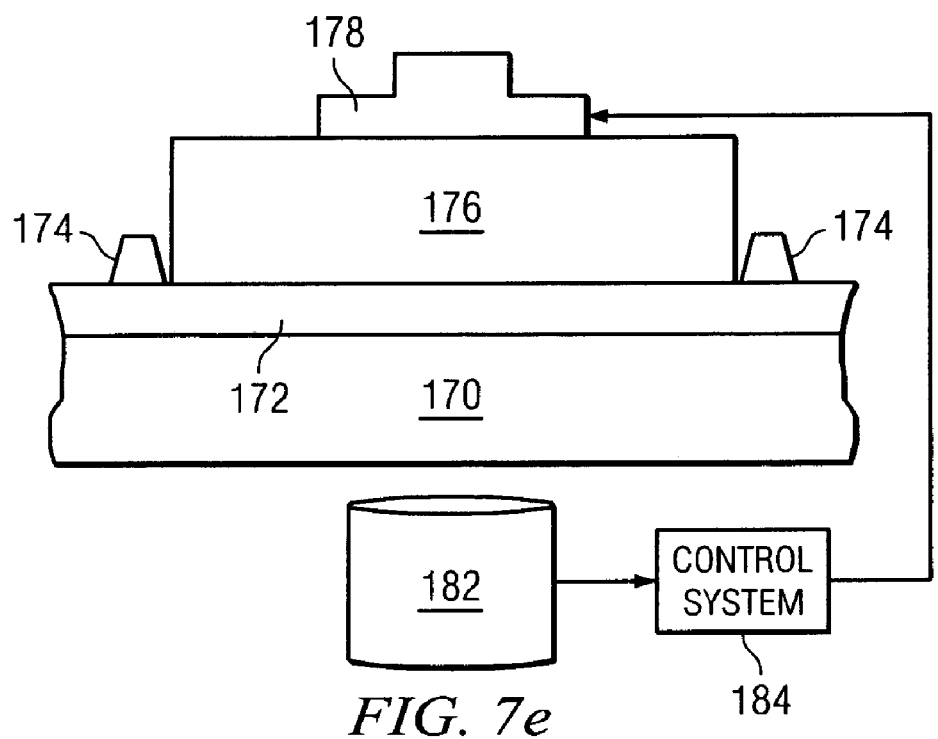

FIG. 7e shows semiconductor die 176 disposed between patterns 174 to align and lock the die to carrier 170. Thus, patterns 174 have caused semiconductor die 176 to be precisely aligned with respect to one another, typically within a 5-10 μm tolerance, and locked into their respective x-y position with a robust structure at predetermined locations in the horizontal plane of carrier 170. By mechanically guiding semiconductor die 176 onto patterns 174, the die are placed on carrier 170 with ease and certainty in their relative location.

In FIG. 7f, an encapsulant or molding compound 188 is deposited over and around semiconductor die 176 using a screen printing, compressive molding, transfer molding, liquid encapsulant molding, liquid dispensing, or other suitable applicator. Encapsulant 188 can be epoxy resin, epoxy acrylate, polymer, or polymer composite material. Encapsulant 188 is non-conductive and environmentally protects the semiconductor device from external elements and contaminants.

During the deposition of encapsulant 188, semiconductor die 176 are locked in their respective x-y position with the robust structure provided by patterns 174 to enhance structural stability and minimize any physical shift during subsequent manufacturing processes, such as die encapsulation. Thus, transverse movement of semiconductor die 176 during subsequent manufacturing processes is substantially eliminated.

After deposition of encapsulant 188, carrier 170, adhesive layer 172, and patterns 174 are removed by chemical etching, mechanical peel-off, CMP, or mechanical grinding. An interconnect structure is formed on the contact pads of semiconductor die 176, as described in FIGS. 4 and 5.

In FIG. 9, a plurality of protruding dams or fiducial patterns 194 are patterned and deposited on a temporary process carrier or substrate 190. An adhesive layer 192 is deposited on a temporary process carrier or substrate 190. Carrier 190 is a transparent dummy or sacrificial base material such as glass or other suitable low-cost, rigid material capable of passing light. In one embodiment, patterns 194 are made with photoresist, polyimide, or other suitable photo-imageable, or stencil printed material. Alternatively, patterns 194 can be metal, polymer, or other rigid material. Patterns 194 are formed using spin coating, screen printing, or spray coating with UV light exposure and wet chemistry development. Alternatively, patterns 194 can be formed with metal stencil printing.

Patterns 194 are positioned at predetermined locations to provide local alignment or guidance for placement of semiconductor die 196. Patterns 194 can be located toward an outside edge of the die or proximate to a mid-region of the die, as shown in FIG. 9. Patterns 194 are reusable on carrier 190. Camera 198 records digital images of semiconductor die 196 through transparent carrier 190. In one embodiment, camera 198 is a CCD. The digital images are provided to control system 200, which in turn controls the x-y directional movement of bond head 202. Control system 200 uses image processing analysis and motor drivers to move bond head 202 until semiconductor die 196 is aligned with patterns 194. Bond head 202 then moves in the z direction to lower semiconductor die 196 onto carrier 190.

An encapsulant or molding compound is deposited over and around semiconductor die 196 using a screen printing, compressive molding, transfer molding, liquid encapsulant molding, liquid dispensing, or other suitable applicator. During the deposition of the encapsulant, semiconductor die 196 are locked in their respective x-y position with the robust structure provided by patterns 194 to enhance structural stability and minimize any physical shift during subsequent manufacturing processes, such as die encapsulation. Thus, transverse movement of semiconductor die 196 during subsequent manufacturing processes is substantially eliminated.

After deposition of the encapsulant, carrier 190, adhesive layer 192, and patterns 194 are removed by chemical etching, mechanical peel-off, CMP, or mechanical grinding. An interconnect structure is formed on the contact pads of semiconductor die 196, as described in FIGS. 4 and 5.

In FIG. 10, an adhesive layer 212 is deposited on a temporary process carrier or substrate 210. A plurality of protruding dams or fiducial patterns 214 are patterned and deposited on adhesive layer 212. Carrier 210 is a transparent dummy or sacrificial base material such as glass or other suitable low-cost, rigid material capable of passing light. In one embodiment, patterns 214 are made with photoresist, polyimide, or other suitable photo-imageable, or stencil printed material. Alternatively, patterns 214 can be metal, polymer, or other rigid material. Patterns 214 are formed using spin coating, screen printing, or spray coating with UV light exposure and wet chemistry development. Alternatively, patterns 214 can be formed with metal stencil printing.

Patterns 214 are positioned at predetermined locations to provide local alignment or guidance for placement of semiconductor die 216. Patterns 214 can be located toward an outside edge of the die or proximate to a mid-region of the die, as shown in FIG. 10. Patterns 214 can be on the outside of the die or middle of the die, as shown in FIG. 10. Camera 218 records digital images of semiconductor die 216 through transparent carrier 210. In one embodiment, camera 218 is a CCD. The digital images are provided to control system 220, which in turn controls the x-y directional movement of bond head 222. Control system 220 uses image processing analysis and motor drivers to move bond head 222 until semiconductor die 216 is aligned with patterns 214. Bond head 222 then moves in the z direction to lower semiconductor die 216 onto carrier 210.

An encapsulant or molding compound is deposited over and around semiconductor die 216 using a screen printing, compressive molding, transfer molding, liquid encapsulant molding, liquid dispensing, or other suitable applicator. During the deposition of the encapsulant, semiconductor die 196 are locked in their respective x-y position with the robust structure provided by patterns 214 to enhance structural stability and minimize any physical shift during subsequent manufacturing processes, such as die encapsulation. Thus, transverse movement of semiconductor die 196 during subsequent manufacturing processes is substantially eliminated.

After deposition of the encapsulant, carrier 210, adhesive layer 212, and patterns 214 are removed by chemical etching, mechanical peel-off, CMP, or mechanical grinding. An interconnect structure is formed on the contact pads of semiconductor die 216, as described in FIGS. 4 and 5.

While one or more embodiments of the present invention have been illustrated in detail, the skilled artisan will appreciate that modifications and adaptations to those embodi-

What is claimed is:

1. A method of making a semiconductor device, comprising:
providing a carrier;
depositing an adhesive layer over the carrier;
forming a plurality of fiduciary patterns over the adhesive layer;
forming a repassivation layer over semiconductor die;
forming alignment slots in the repassivation layer;
leading with the repassivation layer, placing the semiconductor die onto the carrier so that the alignment slots envelope and lock to the fiducial patterns;
depositing an encapsulant over the semiconductor die while the alignment slots remain locked to the fiducial patterns;
removing the carrier, adhesive layer, and fiducial patterns after depositing the encapsulant; and
forming an interconnect structure over the repassivation layer, the interconnect structure being electrically connected to contact pads on an active surface of the semiconductor die.

2. The method of claim 1, wherein the first layer is repassivation, photoresist, polymer dielectric, organic dielectric, or other photo-imageable material.

3. The method of claim 1, wherein forming the interconnect structure includes:
forming a conductive layer over the repassivation layer and into the alignment slots to electrically connect to the contact pads of the semiconductor die;
forming an insulating layer over the conductive layer and repassivation layer; and
forming a solder bump over the conductive layer.

4. The method of claim 1, further including removing the repassivation layer and alignment slots after depositing the encapsulant.

5. The method of claim 4, wherein forming the interconnect structure includes:
forming a first insulating layer over the active surface of the semiconductor die;
removing a portion of the first insulating layer over the contact pads of the semiconductor die;
forming a conductive layer over the first insulating layer to electrically connect to the contact pads of the semiconductor die;
forming a second insulating layer over the conductive layer and first insulating layer; and
forming a solder bump over the conductive layer.

6. The method of claim 1, wherein the fiduciary patterns match repassivation patterns, and have lower height than repassivation layer.

7. A method of making a semiconductor device, comprising:
providing a carrier;
depositing an adhesive layer over the carrier;
forming a plurality of fiduciary patterns over the adhesive layer;
forming a first layer over semiconductor die;
forming alignment slots in the first layer;
placing the semiconductor die onto the carrier so that the alignment slots envelope and lock to the fiducial patterns;
depositing an encapsulant over the semiconductor die while the alignment slots remain locked to the fiducial patterns;
removing the carrier, adhesive layer, and fiducial patterns after depositing the encapsulant; and
forming an interconnect structure over the first layer, the interconnect structure being electrically connected to contact pads on an active surface of the semiconductor die.

8. The method of claim 7, wherein the first layer is repassivation, photoresist, polymer dielectric, organic dielectric, or other photo-imageable material.

9. The method of claim 7, wherein forming the interconnect structure includes:
forming a conductive layer over the first layer and into the alignment slots to electrically connect to the contact pads of the semiconductor die;
forming an insulating layer over the conductive layer and first layer; and
forming a solder bump over the conductive layer.

10. The method of claim 7, wherein the first layer includes a plurality of discrete regions.

11. The method of claim 7, wherein the alignment slots have slanted sidewalls.

12. The method of claim 7, further including:
attaching a bond head to a surface of the semiconductor die opposite an active surface of the semiconductor die; and
moving the bond head in the x, y, and z direction to place the semiconductor die onto the carrier.

13. A method of making a semiconductor device, comprising:
providing a carrier;
forming a plurality of fiduciary patterns over the carrier;
forming a first layer over semiconductor die;
forming alignment slots in the first layer;
placing the semiconductor die onto the carrier so that the alignment slots envelope and lock to the fiducial patterns;
depositing an encapsulant over the semiconductor die while the alignment slots remain locked to the fiducial patterns;
removing the carrier, adhesive layer, and fiducial patterns after depositing the encapsulant; and
forming an interconnect structure over the first layer, the interconnect structure being electrically connected to contact pads on an active surface of the semiconductor die.

14. The method of claim 13, wherein the first layer is repassivation, photoresist, polymer dielectric, organic dielectric, or other photo-imageable material.

15. The method of claim 13, wherein forming the interconnect structure includes:
forming a conductive layer over the first layer and into the alignment slots to electrically connect to the contact pads of the semiconductor die;
forming an insulating layer over the conductive layer and first layer; and
forming a solder bump over the conductive layer.

16. The method of claim 13, wherein the first layer includes a plurality of discrete regions.

17. The method of claim 13, wherein the alignment slots have slanted sidewalls.

18. A method of making a semiconductor device, comprising:
providing a carrier;
forming a plurality of fiduciary patterns over the carrier;
placing the semiconductor die onto the carrier so that the semiconductor die locks to the fiducial patterns;

depositing an encapsulant over the semiconductor die while the semiconductor die remains locked to the fiducial patterns;

removing the carrier, adhesive layer, and fiducial patterns after depositing the encapsulant; and forming an interconnect structure over the semiconductor die, the interconnect structure being electrically connected to contact pads on an active surface of the semiconductor die.

19. The method of claim 18, wherein the fiducial patterns are formed outside and around a portion of a footprint of the semiconductor die.

20. The method of claim 18, wherein the carrier is transparent.

21. The method of claim 18, further including:

providing a camera to generate images of the semiconductor die; and utilizing the images of the semiconductor die to control movement of the bond head.

22. The method of claim 18, wherein the fiducial patterns have slanted sidewalls.

* * * * *